(12) United States Patent
Rubinstein

(10) Patent No.: US 6,691,206 B1
(45) Date of Patent: Feb. 10, 2004

(54) PROCESSOR INTERFACING TO MEMORY-CENTRIC COMPUTING ENGINE

(75) Inventor: Richard Rubinstein, Vancouver, WA (US)

(73) Assignee: Marger Johnson & McCollom, P.C., Portland, OR (US)

( * ) Notice: Subject to any disclaimer, the term of this patent is extended or adjusted under 35 U.S.C. 154(b) by 0 days.

(21) Appl. No.: 08/869,148

(22) Filed: Jun. 4, 1997

Related U.S. Application Data

(63) Continuation-in-part of application No. 08/869,277, filed on Jun. 21, 1997, and a continuation-in-part of application No. 08/821,326, filed on Mar. 21, 1997.

(51) Int. Cl.$^7$ .............................................. G06F 12/00
(52) U.S. Cl. .................. 711/105; 711/173; 395/182.21; 395/581; 395/521
(58) Field of Search ........................... 395/182.21, 581, 395/521, 278; 711/173, 105

(56) References Cited

U.S. PATENT DOCUMENTS

| | | | |
|---|---|---|---|
| 4,086,629 A | 4/1978 | Desyllas et al. ............. | 364/200 |
| 4,757,393 A | * 6/1988 | Kitson et al. ................ | 395/581 |
| 4,862,407 A | 8/1989 | Fette et al. .................. | 364/900 |
| 4,984,205 A | 1/1991 | Sugibayashi ................ | 365/200 |
| 5,088,053 A | * 2/1992 | Sprague et al. ............. | 395/521 |
| 5,179,691 A | * 1/1993 | O'Brien et al. .............. | 395/500 |
| 5,185,694 A | * 2/1993 | Edenfield et al. ........... | 395/287 |
| 5,230,042 A | 7/1993 | Masaki et al. ............... | 395/162 |
| 5,329,630 A | * 7/1994 | Baldwin ...................... | 711/173 |
| 5,396,634 A | 3/1995 | Zaidi et al. .................. | 395/800 |

(List continued on next page.)

FOREIGN PATENT DOCUMENTS

| | | | |
|---|---|---|---|
| DE | 4432217 A1 | 3/1995 | ............. G11C/7/00 |
| DE | 19713178 A1 | 1/1998 | ............ G06F/12/08 |

(List continued on next page.)

OTHER PUBLICATIONS

Article by Karl Guttag et al, A Single–Chip Multiprocessor for Multimedia: The MVP, 11/92.

(List continued on next page.)

*Primary Examiner*—Do Hyun Yoo
*Assistant Examiner*—Mehdi Namazi
(74) *Attorney, Agent, or Firm*—Marger, Johnson & McCollom P.C.

(57) ABSTRACT

Methods and apparatus are disclosed for interfacing a processor bus or CPU to a computation engine to carry out selected tasks with improved efficiency in the computation engine. The computation engine is controlled by an MCC memory-centric controller that provides microcoded operation of the engine independently of the CPU. Essential interfacing between the processor bus and the computation engine includes storing microcode in a separate memory accessible to the MCC controller, or downloading microcode from the CPU/processor bus as needed for a specific task. The MCC controller can reconfigure the computation engine, such as memory block allocation, word size, etc. under microcode control, so that new or user-proprietary algorithms such as those used in dsp can be implemented using a standard computation engine without redesign. Execution of selected tasks on the computation engine is triggered automatically by decoding instructions that appear on the processor bus. Such tasks can include dsp, compression, decompression, encryption or other complex computations, and further can include downloading new or updated microcode into the computation engine desired.

25 Claims, 9 Drawing Sheets

U.S. PATENT DOCUMENTS

| | | | | |
|---|---|---|---|---|
| 5,412,740 | A | | 5/1995 | Fadavi-Ardekani ......... 382/293 |
| 5,434,989 | A | | 7/1995 | Yamaguchi ................. 395/400 |
| 5,448,715 | A | | 9/1995 | Lelm et al. ................. 395/550 |
| 5,515,329 | A | | 5/1996 | Dalton et al. |
| 5,530,946 | A | * | 6/1996 | Bouvier et al. ......... 395/182.21 |
| 5,627,994 | A | | 5/1997 | Levy et al. |
| 5,659,543 | A | | 8/1997 | Ater et al. .................. 370/258 |
| 5,838,334 | A | * | 11/1998 | Dye ........................... 345/503 |
| 5,841,444 | A | | 11/1998 | Mun et al. .................. 345/506 |

FOREIGN PATENT DOCUMENTS

| | | | |
|---|---|---|---|
| DE | 19735981 A1 | 3/1998 | ............ G06F/9/38 |
| EP | 0139254 A2 | 2/1985 | ........... G06F/13/28 |
| EP | 90101507.3 | 1/1990 | |
| EP | 90306464.0 | 6/1990 | |
| EP | 91109333.4 | 7/1991 | |
| EP | 0498107 A2 | 12/1992 | ............ G11C/5/14 |
| EP | 0590807 A2 | 6/1994 | ........... G06F/15/44 |
| EP | 0741356 A1 | 6/1996 | ........... G06F/12/08 |
| EP | 9703849.1 | 5/1997 | |
| GB | 2155671 A | 9/1985 | ........... G06F/13/00 |
| GB | 8510106 | 9/1985 | |
| JP | 09034783 | 7/1997 | ........... G06F/12/08 |
| WO | PCT/US93/10836 | 6/1994 | |
| WO | WO 9412929 | 6/1994 | ............ G06F/9/26 |
| WO | WO 9734231 | 9/1997 | ........... G06F/12/12 |
| WO | PCT/US98/05666 | 10/1998 | |

OTHER PUBLICATIONS

Conference materials by Yoshihiro Fujita et al, A Dataflow Image Processing System TIP–4, 9/89.

Article by Gordon Lang et al, An Optimum Parallel Architecture for High–Speed Real–Time Digital Signal Processing, 2/88.

Paper by M.C. Ertem, A Reconfigurable Co–Processor for Microprocessor Systems, 6/87.

Article by A.C. Davies et al, Interfacing a Hardware Multiplier to a General Purpose Microprocessor, 10/77.

Integrated Device Technology, Inc., 32K×32 CacheRAM With Interleaved/Linear Burst Counter; (Jul. 1996); IDT71V432; pp. 1–14.

IEEE Times, NEC Turns Virtual Channel on Memory Latencies, Nov. 17, 1997, pp. 4–7.

Integrated Device Technology, Inc., 32K×32 MCache Synchonous Pipelined Cache RAM; (1996); IDT71F432; pp. 13.1.1–5.

Integrated Device Technology, Inc., 256KB/512KB Pipelined Burst Fusion Memory Secondary Cache Modules; (Jul., 1996); IDT7MPV6204, 5, 6, 8; pp. 1–7.

Integrated Device Technology, Inc., High–Speed 16K×8 Dual–Port Static RAM; (1990); IDT7006S/L; pp. 1–21.

Texas Instruments, Advance Information, TMS44460, TMS46460, TMS46460P, 1048576–Word by 4–Bit Dynamic Random–Access Memories, Jun., 1995, pp. 4–5–4–6.

DSP56002 Architecture and Addressing Modes, chapter 3, pp. 43–75.

* cited by examiner

PROCESSOR INTERFACING TO MEMORY-CENTRIC COMPUTING ENGINE

RELATED APPLICATION DATA

This application is a continuation-in-part of co-pending application Ser. No. 08/821,326 filed Mar. 21, 1997, and a continuation-in-part of co-pending application Ser. No. 08/869,277 filed Jun. 4, 1997 and entitled "Memory Centric Controller." The prior applications are incorporated herein by this reference.

FIELD OF THE INVENTION

The present invention is generally in the field of digital computing and, more specifically, is directed to methods and apparatus for interfacing between a processor or bus and an execution subsystem or "engine" that employs shared, reconfigurable memory in a highly flexible, microprogrammable, memory-centric architecture.

BACKGROUND OF THE INVENTION

A. Introduction

The prior application, Ser. No. 08/821,326, entitled "Shared, Reconfigurable Memory Architectures for Digital Signal Processing" described the need to improve digital signal processing performance while containing or reducing cost. That application describes improved computer architectures that utilize available memory resources more efficiently by providing for shared and reconfigurable memory so as to reduce I/O processor requirements for computation intensive tasks such as digital signal processing. The memory systems described in the prior case are shared in the sense that a given block of memory can first be configured for access by the CPU, for example to load data, and then "swapped" so that the same block of physical memory can be directly accessed by an execution unit, for example a DSP execution unit, to carry out various calculations on that data. After the calculations are completed, the same block of memory can be "swapped" once again, so that the CPU has immediate access to the results.

The memory is reconfigurable in a variety of ways, as described below, so as to allocate memory resources as between the CPU and the execution unit (or multiple execution units) in the most efficient manner possible. Reconfiguring the memory can include forming memory blocks of various sizes; selecting write (input) sources; selecting read (destination) targets; selecting word size, and so forth. Various particulars and alternative embodiments are set forth below, so as to enable one skilled in the art to implement shared, reconfigurable memory architectures. The parent case described the invention with reference to digital signal processing. However, DSP is just one example of computation-intensive calculation. The concepts of the prior case as well as the present invention are applicable to a wide variety of execution tasks, including but not limited to DSP and related tasks such as motion picture encoding, decoding, and encryption, decryption, etc.

B. Memory Centric Controller

Another aspect of the prior application is a memory-centric DSP controller ("MDSPC"). The MDSPC was described as providing memory address generation and a variety of other control functions, including reconfiguring the memory as summarized above to support a particular computation in the execution unit. The name "MDSPC" was appropriate for that controller in the context of the parent case, in which the preferred embodiment was described for digital signal processing. However, the principles of the parent cases and the present invention are not so limited. Accordingly, the related application entitled MEMORY CENTRIC CONTROLLER uses its title (or "MCC)" to describe the a controller which is functionally similar to the "MDSPC" introduced in the earlier parent case. The MEMORY CENTRIC CONTROLLER application describes the structure and operation of the MCC in greater detail, and includes detailed description of interfacing between the reconfigurable memory referred to above and one or more execution units. More specifically, the MCC application describes "bandwidth matching" methods and apparatus to ensure that the execution unit can be operated at maximum throughput even where the memory, e.g. DRAM, is relatively slow.

It is no less important to system performance, however, to ensure sufficient bandwidth at the interface between the memory-centric engine and the host processor bus. Further, bandwidth alone is not enough; compatibility with existing standard interfaces or bus specifications is highly advantageous for reasons explained below. The present application thus is directed to methods and apparatus for interfacing between a processor or bus and a memory-centric execution subsystem or "engine" of the type described in the two related applications identified above.

C. DMA and Custom CPU Interface

The memory-centric architecture as described in the prior applications interfaces with a microprocessor core using essentially two types of interface, each of which is known in prior art for memory access. The first is DMA—Direct Memory Access. A DMA transfer allows moving a block of data into or from a memory without requiring cycles of the CPU processor or core. Instead, a DMA controller, generally hardware, handles the transfer and notifies the CPU when the transfer is done. The DMA is given a start location or address and a length count, and provides addressing to the memory. In the prior applications, we noted that the MDSPC (or MCC) includes DMA hardware for handling such tasks. We also refer to an I/O channel as one that allows DMA transfers. The DMA controller can be on board (or within) a processor or part of another component of the system. Thus one method for interfacing is to treat the MCC as a coprocessor to the core and communicate with it (i.e. transfer data) by employing I/O or DMA methodologies analogous to those known in prior art. One problem with DMA transfer, however, is the DRAM in the memory-centric engine may not provide adequate transfer rates to support the host bus. Alternatively, one can interface with the MCC by utilizing an existing co-processor interface provided on the particular processor core implementation being deployed.

A more direct interface is to modify the processor core architecture to accommodate the memory-centric engine directly. This solution is preferred in terms of optimizing performance and minimum transistor count. It provides maximum computing engine performance together with optimum core processor performance. The problem with that approach is that custom modification of an existing core architecture or hardware implementation is a difficult and time consuming—and therefor expensive—task. Core designs are complex and modifying them requires substantial engineering resources and time-to-market. Therefore, custom modification of each core processor design as a prerequisite to implementation of a memory-centric engine can be expected to impede implementation of the MCC engine.

In view of the foregoing background, the need remains for an architecture solution that will provide a standard interface, in other words i.e., take advantage of known and existing interfacing methods and apparatus. In other words, the need remains for a way to interface to a memory-centric computing engine, that provides enhanced performance and high bandwidth without requiring custom modification of the host processor core, yet still provide performance improvements over standard interfaces such as DMA and standard I/O channels or interfacing via a co-processor bus.

SUMMARY OF THE INVENTION

A memory-centric computing engine provides any one of several standard interfaces. For example, a standard memory interface can be provided. In this case, the interface includes address lines, data lines, and control signals such as RAS/ (row address strobe), CAS/(column address strobe), write enable, output enable, etc. In other words, the MC engine presents itself to the processor like a memory. However, techniques are shown below that provide SRAM speed at the interface combined with DRAM density in the engine so as to accommodate complex computations requiring substantial amounts of data.

This invention provides simplified yet high performance interaction between the engine and the host. For example, the processor can load a calculation "problem" (data) into the apparent "memory" and, after execution, simply read out the results using the same methods as a standard DRAM memory read operation. In the meantime, the MC engine performed the necessary operations.

The interface is configurable under microcode control. It can accommodate a memory interface, CPU bus interface, or indeed virtually any given standard or specification. Examples include the PCI Local Bus, VME Ebus, RAMBUS, etc. Other presently known bus interface standards are the Sun SBUS, PCMCIA, Multibus and the ISA and EISA—commonly called the IBM AT bus. Detailed technical specifications of these standards are widely published and therefore need not be detailed here.

According to one aspect of the invention, a method of interfacing a processor bus to a computation engine having a microprogrammable memory-centric controller and an array of memory is defined. The claimed method includes the steps of providing a predetermined series of microcode instructions for execution by the MCC; selecting a start address within the series of microcode instructions for carrying out a corresponding operation; and executing the series of microcode instructions in the MCC beginning at the selected start address so as to carry out the corresponding operation in the engine. The series of microcode instructions can be stored in a non-volatile memory accessible to the MCC; or in a non-volatile external memory accessible to the MCC. Alternatively, using the disclosed architecture, microcode can be downloaded under processor control to a separate microcode storage memory accessible to the MCC, or into the array of memory (DRAM) in the computation engine.

Another aspect of the invention also directed to interfacing with a bus is a method of downloading the microcode instructions by first asserting a predetermined address; decoding the predetermined address in the MCC; and in response to the decoding step, configuring the engine for storing the microcode instructions under processor control into the array of memory. The decoding can be done by "hard-wired" logic or it can be microcode programmable, or a combination of the two.

According to another aspect of the invention, the computing engine includes an SRAM buffer memory and the memory array comprises an array of DRAM memory. In operation, a write operation for example includes storing data from the external bus into the SRAM buffer memory and then transferring the stored data from the buffer memory into the DRAM array.

According to a further aspect of the invention, moving the stored data to the DRAM array includes writing a series of data words into a latch and then writing the contents of the latch into the DRAM array in a single write operation so as to improve matching access time of the SRAM buffer memory to access time of the DRAM array.

Thus the present invention provides methods and apparatus to reconfigure hardware, move data, etc. control executions, conduct testing, and provide high-speed interface, while maintaining compatibility with known standard bus interface specifications. Moreover, because easily reconfigured under software control, can easily be adapted and changed to a different interface as may be required. For example, the data format, word size, error correction bits, addressing format etc. can all be changed within the bounds of the available number of "wires" of signal lines. Thus, the memory-centric engine can interface with, say the PCI bus in one application, while the same or an identical chip can comply with RAMBUS standards in another application. Bandwidth of course is key, and we show below the methods and apparatus for interfacing at the appropriate bus speed, using SRAM buffer cells and memory block swapping techniques.

The foregoing and other objects, features and advantages of the invention will become more readily apparent from the following detailed description of a preferred embodiment of the invention which proceeds with reference to the accompanying drawings.

DETAILED DESCRIPTION OF PREFERRED EMBODIMENTS

Figure 1:
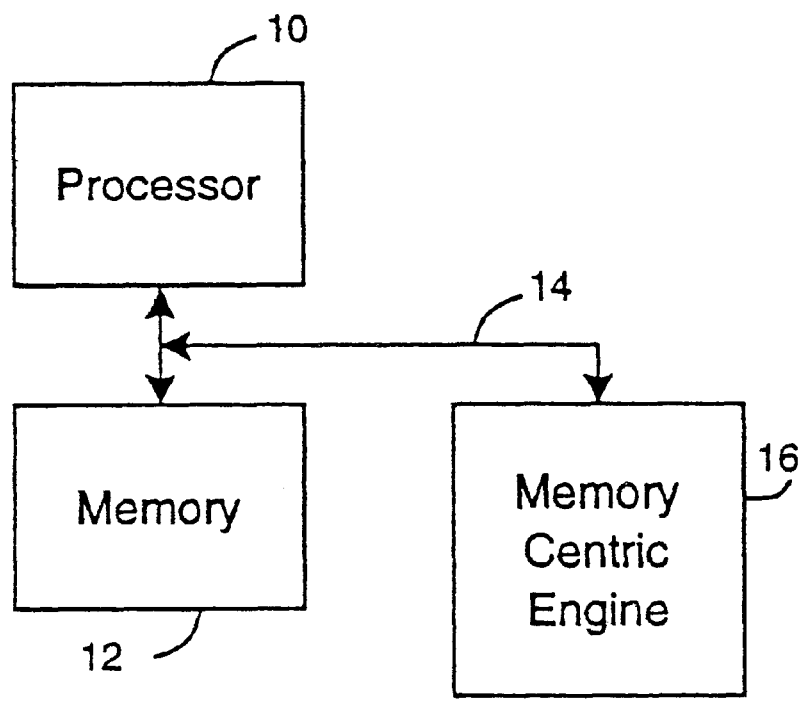
FIG. 1 is a simplified block diagram showing interconnection of a digital processor and memory subsystem to a memory-centric computing engine via a standard bus interface.

We begin with a brief description of the hardware configuration. FIG. 1 is a simplified block diagram showing the interconnection of a processor, such as a known microprocessor 10, coupled to a conventional memory 12 via a bus 14 ("Z"). A memory centric computing engine 16 of the type described in the two prior applications identified above also is coupled to bus 14 for transfer of address, data and control information among these three system components. A system of this type can be implemented in one or more integrated circuit, although the present state of the art provides only limited memory space on board a typical CISC microprocessor. The memory centric computing engine 16 is intended to include a substantial amount of memory, for example DRAM, as explained in the prior application. The particular arrangement of address, data and control signals, and interfacing or "handshake" protocols varies with the various different microprocessors and bus architectures. As described below, the interface apparatus and methodologies of the present invention are highly flexible so as to provide compatibility with various interfaces without hardware modification.

Figure 2:
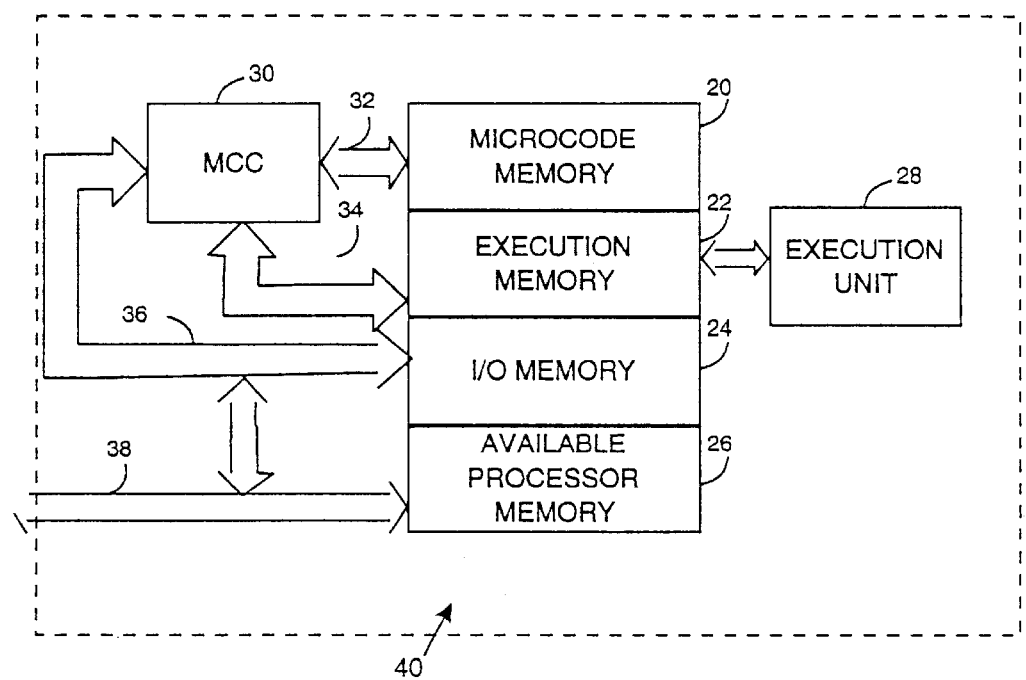
FIG. 2 is a block diagram showing more detail of the memory and control portions the memory-centric computing engine 16 of FIG. 1.

FIG. 2 shows the memory centric engine 16 in somewhat greater detail. In this illustration, a memory space 40 is shown as being partitioned into four blocks of memory identified as a microcode memory 20, execution memory 22, I/O memory 24 and available processor memory 26. As described in the parent application, the memory is configurable so as to form one or more blocks of memory, each sized as may be required for a particular operation. One or more execution units, for example execution unit 28, is coupled to the execution block of memory 22 for transfer of data therebetween. The memory centric computing engine is controlled by the memory centric controller (MCC) 30, as described in detail in the related application entitled MEMORY CENTRIC CONTROLLER. For example, it controls configuration of the memory 40, and provides address generation for each block of memory. Buses 32, 34 and 36 in this drawing generically represent address, data and control lines. Finally, both the I/O memory block 24 and processor memory block 26 have data ports coupled to internal bus 38 which in turn is connected to the external bus 14. Operation of this architecture is described in detail in the memory centric controller application, except for the interface to the external bus 14.

Figure 3:
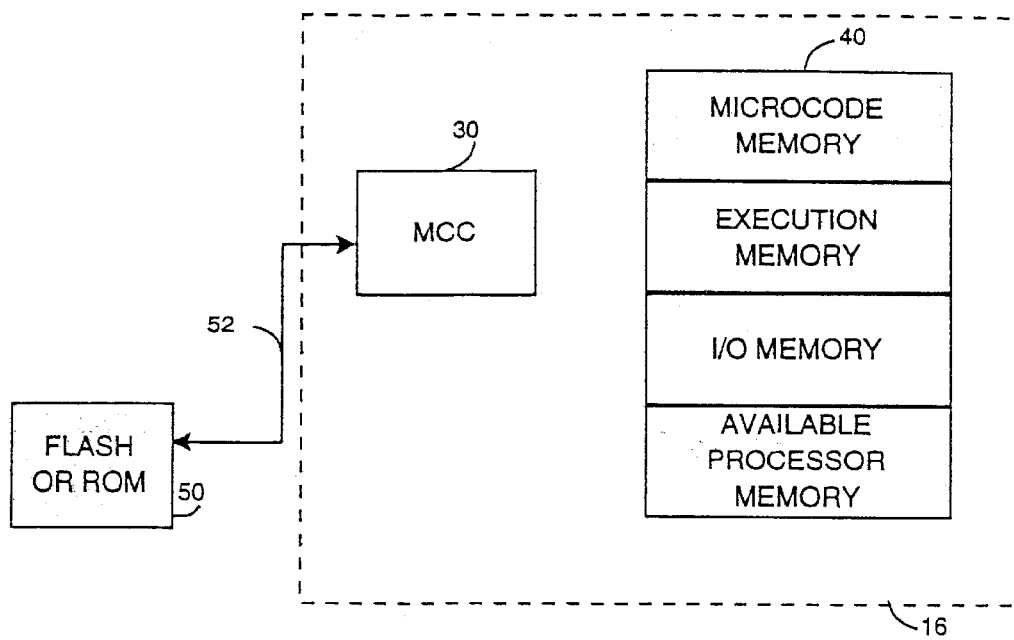
FIG. 3 is a simplified block diagram showing interconnection of the memory-centric computing engine to a flash or other memory for accessing stored microcode.

FIG. 3 is a simplified block diagram illustrating connection of the engine 16, more specifically the MCC controller 30, to a flash, ROM, or other non-volatile memory 50, via path 52. The flash or ROM storage 50 is used to store microcode executable in the MCC. One mechanism for loading microcode is to arrange the MCC so that, upon initialization, it downloads microcode directly from the external device 50. Further description of operation of the system is provide below following an overview of the hardware arrangement.

Figure 4:
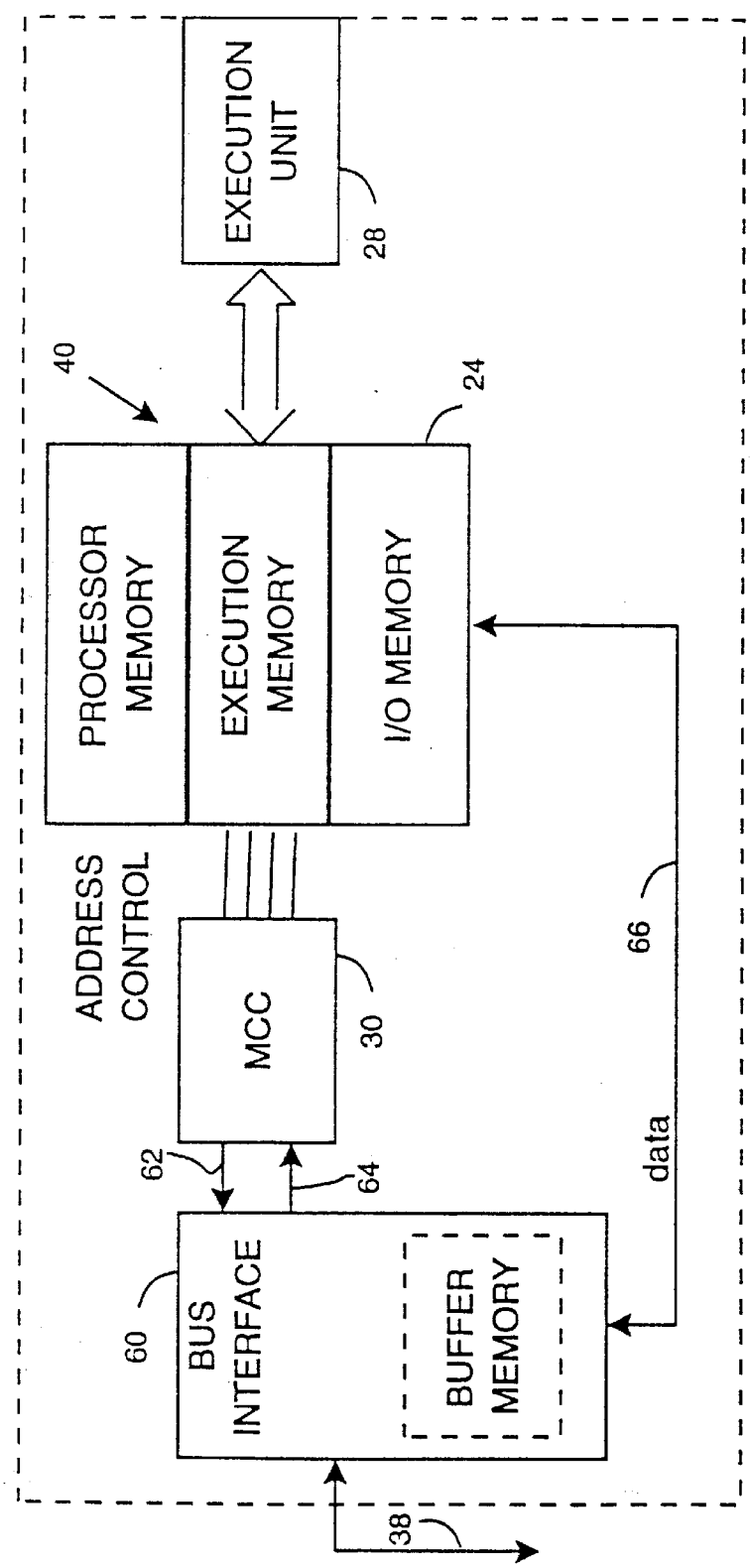
FIG. 4 is a simplified block diagram illustrating one implementation of the memory-centric computing engine that includes a bus interface controller with buffer memory.

FIG. 4 is a simplified block diagram illustrating one implementation of the memory centric computing engine that includes a bus interface controller ("BIC") 60. FIG. 4 shows the memory 40 coupled to the MCC controller 30 as described previously. Here, the BIC 60 provides for interfacing the memory centric engine to a standard or customized bus interface. The external bus 38 can include various control and address signal lines, but at a minimum includes at least one data line (serial interface) though it will often include a plurality of data lines for bite-wide or word-wide data transfer. The MCC 30 provides control signals 62 to the BIC 60 to synchronize communication from the BIC to the I/O memory block 24. Data is transferred over bidirectional, internal data bus 66 between the BIC and the I/O memory block 24. The bus interface unit (BIC) provides control signals 64 to the MCC so as to provide status information. For example, such information can include the status conditions of a buffer memory in the BIC. In addition, fast address decoding (further explained later) can be implemented in the BIC and resulting control signals provided to the MCC. The bus interface controller, or BIC, further includes a buffer memory 68 which is used for buffering data in connection with data transfers between the external bus 38 and internal data bus 66. The status conditions provided in connection with loading and unloading the buffer memory 68 enable the MCC to evaluate when a communication from the I/O memory block to the bus interface should be initiated or, conversely, a communication from the bus interface to the I/O memory block. (These status signals are distinguished from the status word or block used for communication between the MCC and the host processor as explained later.) Preferably, the buffer memory 68 comprises SRAM or other high speed memory in order to accommodate high speed data transfer to and from the external bus 38 as further described later.

Figure 5:
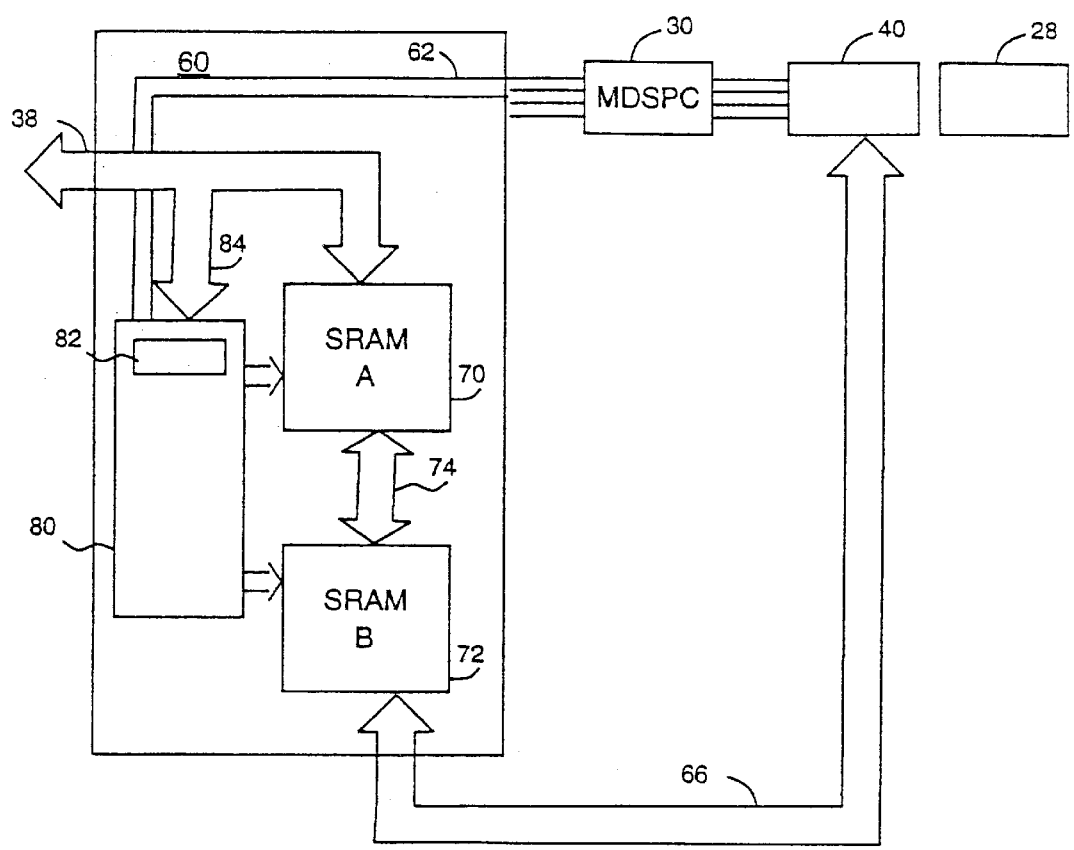
FIG. 5 is a block diagram of the memory-centric computing engine of FIG. 4 showing greater detail of the interface controller and including multiple blocks of interface buffer memory.

FIG. 5 is a block diagram of the computing engine of FIG. 4 showing greater detail of the bus interface controller 60. In this implementation, the BIC 60 includes a buffer memory, comprising SRAM block A 70 and SRAM block B 72 together forming the buffer memory. SRAM memory is preferred for its high speed as mentioned above. A single block of memory could be used. However, it will be advantageous in many applications to use two or more blocks or memory which can be "swapped" as described in detail in the parent application entitled SHARED, RECONFIGURABLE MEMORY ARCHITECTURES FOR DIGITAL SIGNAL PROCESSING. Specifically, one block of SRAM, for example 70, can be coupled to the external bus 38 to transfer data (bidirectional). Concurrently, the second memory block B can be coupled to the internal data bus 66 for transferring data into the memory 40 for execution or to fetch results. After a given block of data has been transferred, the buffered memory SRAM blocks A and B are swapped, i.e. block A is coupled to the internal data bus 66, and block B is coupled to the external bus 38 to begin transferring a subsequent block of data.

Figure 8:
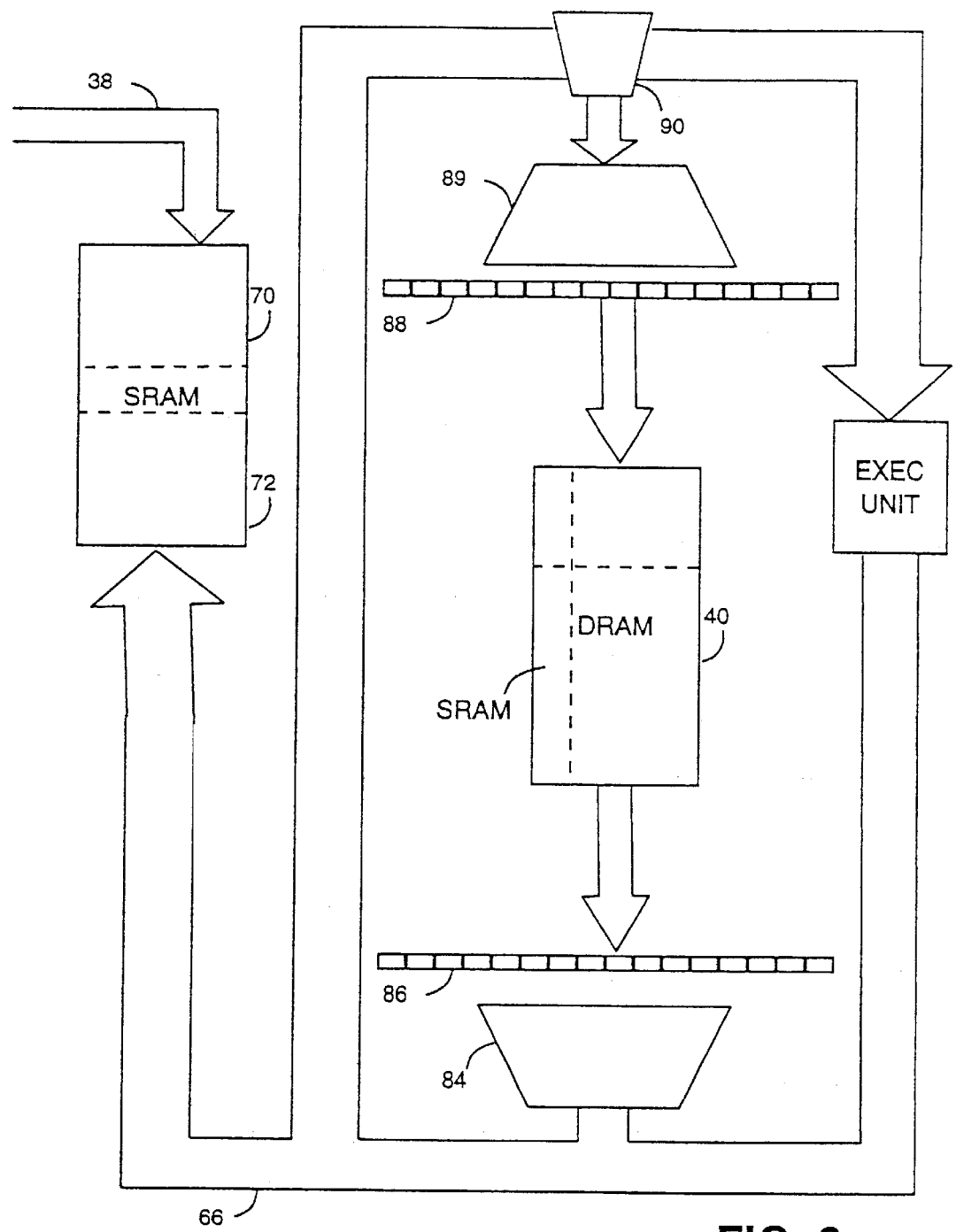
FIG. 8 is a block diagram illustrating interfacing SRAM buffer to DRAM array for bandwidth matching.

Data transfer via the internal data bus 66 requires matching bandwidths of the fast SRAM 72 with relatively slow DRAM 40. One technique for doing so is to configure the I/O block of DRAM 40 so that each row is an integer multiple, for example 8 or 16 times, the word size, i.e. the number of bits of data words in the buffer SRAM 70, 72. Referring to FIG. 8, demultiplexer circuit 84 directs successive words from bus 66 into respective locations in a wide high speed latch 86. Accordingly, it takes multiple reads of the SRAM buffer, say 16 cycles, in order to fill the wide latch 86. When the latch 86 is filled, the wide word is transferred in a single write cycle into the wide I/O memory block in DRAM 40. These operations are controlled by the MCC 30 in a manner analogous to the execution unit bandwidth matching described in the related case identified above. In fact, multiplexer, demux and latch hardware for reading and writing the DRAM 40 can in some configurations be shared as between the internal data bus 66 and the execution unit 28. In this manner, the transfer rate over internal bus 66 can essentially be matched to the bandwidth of the external bus 38. Similarly, in order to read data from the DRAM, a wide word of data can be written into the wide latch in a single read cycle, and then individual bytes or smaller words sequentially routed through a multiplexer to the data bus 66 for output at a correspondingly higher transfer rate to the host.

Figure 6:
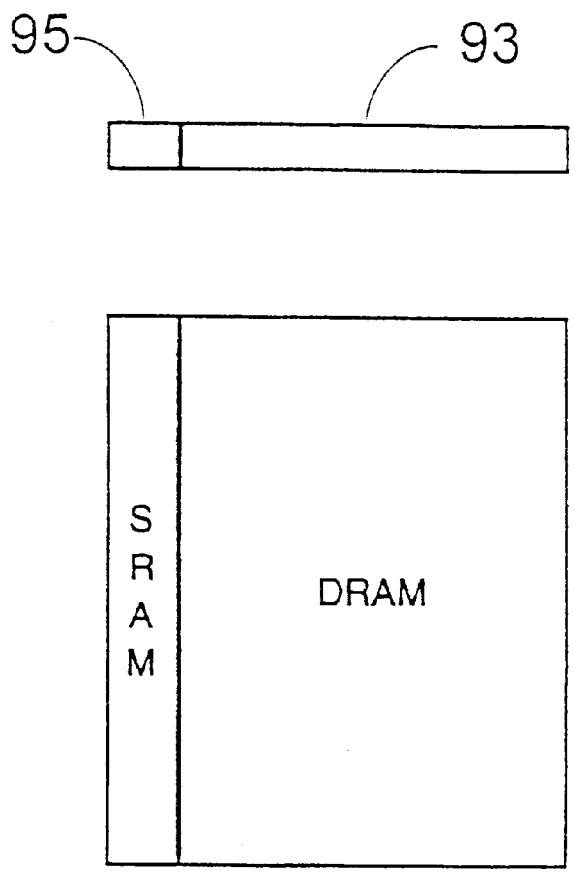
FIG. 6 is a conceptual diagram of a DRAM array in which the first or leading edge bits of each row of the array are implemented with SRAM cells to provide high speed access.

However, a read operation still suffers from the relatively long latency of a read cycle before the first word of data becomes available. This problem can be addressed through the selective use of SRAM cells in DRAM array, or at least in the I/O memory block. For example, the first word or two of each row 93 of the memory could be implemented in SRAM cell 95 rather than DRAM. See FIG. 6. In this way, when a given row of the memory is accessed, the first word or two becomes available for transfer to the internal data bus at SRAM access speed. While that initial data is transferred, the rest of the row is latched in the wide latch described above and then sequentially transferred onto the bus in smaller units.

The use of SRAM cells in part of the DRAM array can be especially useful in telecom applications such as a router, where the format of the data, e.g. packet size, is predetermined and fixed. In that case, the engine can be configured so that every memory access in on an even row boundary. Accordingly, the data first accessed, i.e. the first word of the row, is always an SRAM word, ergo latency is minimized.

The size of each DRAM row is not critical, and depends upon the particular application. Preferably, a relatively wide word size is implemented to allow greater data transfer bandwidth as explained below.

DRAM Memory with SRAM Interface

Figure 7:
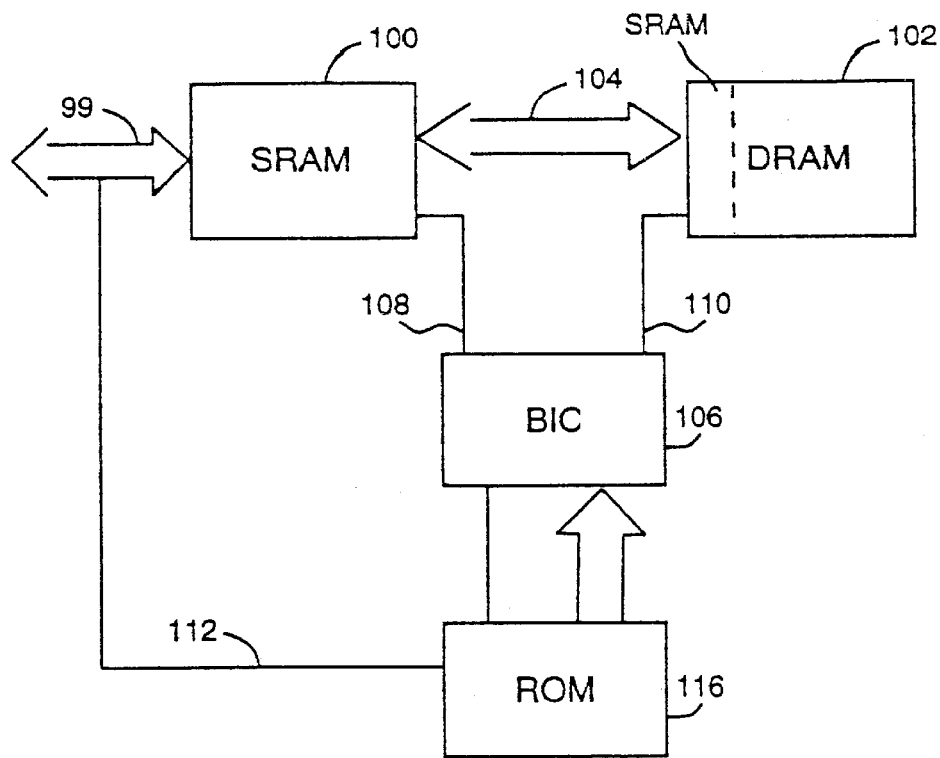
FIG. 7 is a block diagram of a pseudo-static RAM architecture utilizing a DRAM array together with a bus interface controller.

The methods an apparatus described above can be used to provide for DRAM storage having SRAM interface speed. Here we use the terms "DRAM" and "SRAM" merely as illustrations or shorthand to indicate on the one hand a relatively dense but slow memory (DRAM) and, on the other hand, a less dense but faster random access memory (SRAM). The bandwidth matching and buffering techniques described herein can be applied to other memory technologies. Referring to FIG. 7, bus 99 represents a standard SRAM interface, comprising data signal paths coupled to a data port of an SRAM array 100 and control signals 112 which, in this case, are directed to a bus interface controller 106. The interface 99 can conform to standard memory interface, for example, comprising data lines, address lines, address strobes, read/write enable signals, and the like.

A data port of the SRAM 100 is coupled to a data port of a relatively large DRAM array 102 via an internal data bus 104. The bus interface controller 106 provides addressing and control signals 108 to the SRAM 100 and provides synchronization handshaking with the MCC. The MCC, in turn, provides address generation and control signals 110 to the DRAM array 102. Thus the SRAM can interface with the bus 99 at relatively high speed, while the DRAM array 102 provides relatively large and inexpensive storage. Of course, this system will not provide true random access to any location in the DRAM array at SRAM access times. Nonetheless, for many applications, it will be highly advantageous. A ROM or other non-volatile storage or writable control store 116 can be provided to store a microcode for execution in the BIC 106. Alternatively, the BIC can be hard wired to implement a particular application. As another alternative, microcode can be downloaded into the BIC or into the DRAM using the techniques described herein in the context of the memory centric computing engine. The architecture of FIG. 7 thus provides a pseudo-static memory device useful in many applications.

FIG. 8 shows portions of the apparatus of FIG. 7 in greater detail. Here, the bandwidth matching hardware mentioned above is shown explicitly, During a read operation, a wide row of the DRAM 40 is written into a wide, high-speed latch 86. Individual portions or words of data from latch 86 are directed through demultiplexer 84 onto the internal data bus 66 and transferred into the SRAM 70, 72 one at a time. Conversely, for a write cycle, the input data is directed through MUX multiplexer 90 into a demultiplexer 89 which in turn directs individual words of data into successive locations in a wide latch 88 until the latch is filled. Each time the latch is filled, the wide word is written broadside into the DRAM 40. Where this circuit is implemented in a memory alone, the multiplexer 90 is unnecessary. In the context of a computation engine, multiplexer 90 can be used for switching data into the DRAM from an execution unit.

In an alternative embodiment, the execution unit can be coupled directly to the internal data bus 66 for streaming data into execution from the buffer memory 68 for high speed operation, essentially bypassing the DRAM. In this implementation, the MCC configures the execution path accordingly, and provides synchronization and control signals to the BIC which, in turn, provides address generation and control to the SRAM buffer. Alternatively, the op code generator and latch timing and control block of the MCC, described in the related MCC application, can be extended to provided address generation for accessing the SRAM buffer. This mode of operation can be enabled through microcode just as other operations described herein.

OPERATION

1. Supply Microcode

First we describe how microcode is supplied to the MCC using the architecture described above. It can be done in several ways, depending on the particular application. In one example, the processor 10 executes program in external memory 12, and under that program control loads microcode into the engine via bus 14 (Z)—using the well-known DRAM interface mentioned previously.

Alternatively, the available processor memory 26 located in the engine could also be source of program running on the processor 10 to supply the microcode to the engine via bus 14 and memory block 26.

Figure 9:
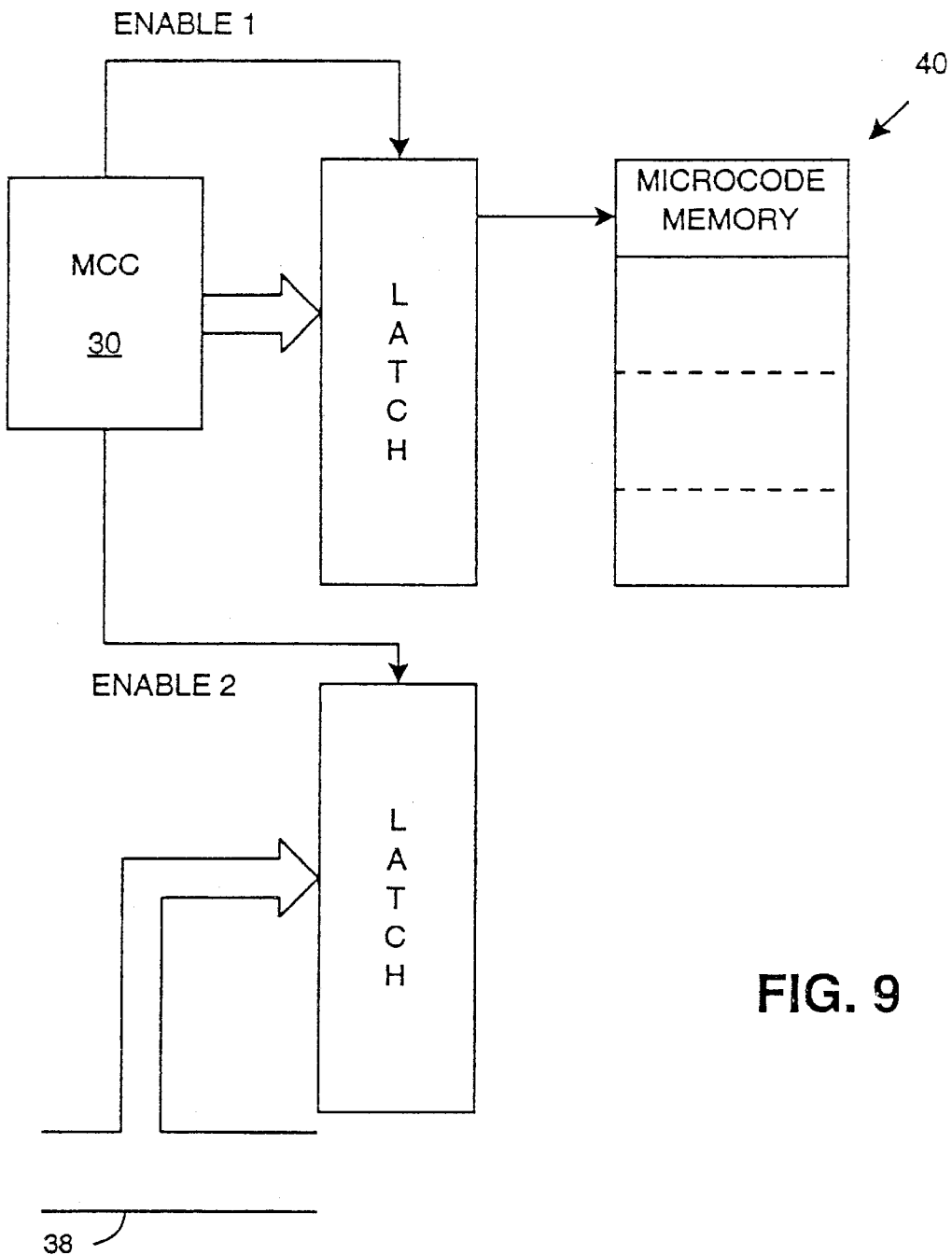
FIG. 9 is a simplified diagram showing addressing for accessing the microcode memory by the external bus or by the MCC.

Another example is a combination of running on memory 12 and available processor memory 26 so as to support the generation of microcode. In other words, the processor program execution generates the microcode. p A further method of supplying microcode to the MCC is to load it into a microcode block of memory 20. In other words, predetermined microcode is passed via the Z-bus into the micro-code space 20 under processor control while the MCC is passive. In this case, the addressing is handled by the processor as indicated in FIG. 9. As illustrated in the FIG. 9, a first address latch can be used for processor addressing of the microcode memory space to download microcode, and a second address latch is enabled during execution of the microcode. The outputs of the address latches can be wired-OR together. See FIG. 9. This process is initiated by the MCC is response to decode of a predetermined (phantom) address that implies or triggers this operation, i.e. a memory mapped operation. A hard-wired decode (or a dedicated pin) can be provided for power-up reset. Another mechanism for loading the microcode into the MCC is on initialization—it automatically (as part of initialization) reads in code directly from a flash or ROM type of device 50, external to the engine, as illustrated in FIG. 3. By "engine" we mean MCC controller together with a memory subsystem. See FIG. 3. The application shown in FIG. 3 is embedded; it does not require a microprocessor either on or off the memory centric device.

2. Address Decode Operations

A microprocessor can be used to provide the I/O driver or starting address to bring the micro-code into the MCC. The microprocessor addresses its memory or program to obtain address information or a predetermined bit pattern to send via Z to the MCC. The MCC includes or has access to address decoding logic (not shown) where the received address or bit pattern is decoded and can initiate any one of the following operations, each implied by a predetermined address or bit pattern:

1. Load microcode from external memory into the engine 16 via MCC 30;
2. Initiate an actual memory centric library operation such as calculate FFT, FIR, convolution, MPEG encode/decode, etc. Includes initiating a subroutine for re-ordering locations for certain algorithm requirements, as described in the MCC application identified above.
3. Initiate an I/O operation between the microprocessor and the engine.

The decoding used to control or "trigger" operation of the MCC can be implemented in several ways:

a. Hard-wired logic; very fast decode, simple to implement.
b. Software (microcode) programmable. Allows microcode to determine what address or bit pattern decodes to what operation; highly flexible, a little more complex, slower to decode.
c. Combination—e.g. 4 or 8 hard-wired decodes, together with others programmable. Notice, at least a few hard wired addresses are useful for downloading or "bootstrapping" more microcode, for power-up reset and other special operations.

The address decoding logic can be implemented in the MCC and or in the BIC. Importantly, the operations required to run the memory-centric engine do not require the use of any extended instructions of the processor. In other words, the interface is adaptable through microcode as described above to comply with virtually any existing bus or processor interface standard. The interface apparatus and methods disclosed here are applicable independently of whether a processor coexists on the same chip as the memory-centric engine or is external to it. This allows wide applicability of the new MC architecture without having to custom modify exiting processors, bus architectures, cores, etc. Accordingly, one architecture—one chip design—can be used for many applications while providing performance at least on a par with more expensive full-custom designs and other programmable solutions.

3. Operation Example using Status Block

Following is an example of a sequence of operations of the architecture:

STEP 1. Address 21x710 initiates loading of microcode into chip under processor control STEP 2. Processor . . . provides micro-code data to MC engine as a form of DMA transfer to memory;

STEP 3. Address 21x777 this address decodes in the MCC to initiate an internal execution operation in the engine such as FFT, FIR, etc.

STEP 4. Address 23x020 This address is decoded by the MCC—causing it to evaluate the status block resident within the MC engine.

The status word or block can be part of the DRAM array, or a dedicated register in the MCC or in the BIC. Status information can include, for example, read overflows, library operations completed (e.g. FFT); or re-ordering data completed, etc. Also, with regard to BIST (built-in self test), the test results can be formed in the status block and then read out via a standard interface. Built-in self test is further described in the MCC application.

STEP 5. Status word or words are then sent directly back to the processor; via the memory sending back data words to a series of consecutive (or ordered) addresses supplied by the processor after the address 23x020 is asserted as above. Thus, for example, overflows, status of execution (extent completed), operations completed and waiting for I/O command are examples of status bits or data words that can be returned to the processor.

One can observe from this description several advantages. For example, a processor can load and start the microcontroller executing a selected function without any special or custom interface signals or control or data paths. Any standard bus or memory interface can serve as the interface to the MC engine. Moreover, the status block or word can be used to provide status information to the processor whenever desired, thus allowing the processor to poll the location. In other applications where processor interrupts are implemented, they could be used along with or as alterative to the polled status block. The status block is highly flexible, and can provide as much (or as little), information as required. For example, it could be used to provide detailed information about ongoing executions. It can also provide self-test results.

To summarize this aspect of the invention, the interface methodology provides for loading microcode, initializing various operations, retrieving status information, etc. all without changing standard interface hardware, signals and while using only standard (native) processor instructions. In addition, the bus interface controller and associated buffer memory accommodate high-speed interfaces as required, while the MCC and DRAM array generally operate at relatively low speed, thereby reducing power consumption in the chip.

Having described and illustrated the principles of the invention in a preferred embodiment thereof, it should be apparent that the invention can be modified in arrangement and detail without departing from such principles. I claim all modifications and variation coming within the spirit and scope of the following claims.

I claim:

1. A method of interfacing a host processor bus to a computation engine having a micro-programable memory-centric controller (MCC) and an array of computation memory, the processor bus being coupled to a host processor and to main memory, and the method comprising the steps of:

providing a predetermined series of MCC microcode instructions executable by the MCC;

storing the MCC microcode instructions in a memory accessible to the MCC;

receiving an instruction on the host processor bus;

decoding the received instruction on in the MCC to detect an instruction executable on the computation engine;

only if the decoded instruction has a corresponding operation executable on the computation engine, selecting a start address within the series of MCC microcode instructions for carrying out the decoded instruction; and executing the series of MCC microcode instructions in the MCC beginning at the selected start address so as to carry out the corresponding operation in the computation engine without using host processor cycles.

2. A method according to claim 1 wherein said storing the series of microcode instructions comprises storing the microcode instructions in a non-volatile memory accessible to the MCC.

3. A method according to claim 1 wherein said storing the series of microcode instructions comprises storing the microcode instructions in a non-volatile external memory accessible to the MCC.

4. A method according to claim 1 wherein said storing the series of microcode instructions comprises downloading the microcode instructions under processor host control to a microcode storage memory accessible to the MCC.

5. A method according to claim 1 wherein said providing the series of microcode instructions comprises downloading the microcode instructions under processor control into the array of memory in the computation engine.

6. A method according to claim 5 wherein said downloading the microcode instructions includes asserting a predetermined address; decoding the predetermined address in the MCC; and in response to the decoding step, configuring the computation engine for storing the microcode instructions under host processor into the array of computation memory.

7. A method according to claim 6 wherein said configuring step includes coupling an address provided by the processor to the memory array so as to address the memory array under processor control.

8. A method according to claim 1 wherein said selecting a start address in the microcode includes receiving a predetermined address from the processor and decoding the said address so as to identify a corresponding start address in the microcode, thereby selecting the corresponding operation without requiring a custom or dedicated interface to the engine.

9. A method according to claim 1 wherein:
the computing engine includes an SRAM buffer memory and the computation memory array comprises an array of DRAM memory;
the corresponding operation is a data write operation into the computing engine; and
said executing step includes storing data from the processor bus into the SRAM buffer memory and then transferring the stored data from the buffer memory into the computation memory DRAM array thereby providing data transfer from the processor bus into the computation engine at SRAM speed.

10. A method according to claim 9 wherein said transferring the stored data to the DRAM array includes writing a series of data words into a latch and then writing the contents of the latch into the DRAM array in a single write operation so as to improve matching access time of the SRAM buffer memory to access time of the DRAM array.

11. A method of interfacing a processor bus to a computation engine having a microprogrammable memory-centric controller and an array of memory, the method comprising the steps of:
providing a predetermined series of microcode instruction for execution by the MCC;
selecting a start address within the series of microcode instruction for carrying out a corresponding operation; and
executing the series of microcode instruction in the MCC beginning at the selected start address so as to carry out the corresponding operation in the engine;
wherein said selecting step includes decoding an address asserted by the processor and said decoding step includes providing hare-wired decoding logic in the MCC arranged so that at least one selected address automatically decodes so as to initiate a predetermined operation.

12. A method according to claim 11 wherein said operation comprises downloading microcode in the MCC.

13. A memory-centric computing engine for connection to an external processor bus to supplement operation of a CPU also coupled to the processor bus, the computing engine comprising:
an array of DRAM memory on board the computing engine;
an execution unit coupled to the DRAM array for executing selected operations on data stored in the DRAM array;
a memory controller (MCC) for controlling and addressing the DRAM array; and
a bus interface controller for interfacing the engine to the processor bus; and
a buffer memory under control of the bus interface controller and coupled both to the processor bus and to the DRAM memory array for buffering data transfers between the DRAM memory array and the external processing bus;
wherein the DRAM array includes an executing memory block and an I/O memory block, and the DRAM array is reconfigurable under control of the MCC for swapping said blocks of memory to reduce latency of data transfer operations; and
wherein he I/O memory block comprises rows of memory cells, each row having a number of bit cells equal to an integer multiple of the buffer memory word size selected for bandwidth matching the buffer memory and the DRAM array.

14. A memory-centric computing engine according to claim 13 wherein the buffer memory comprises SRAM memory cells.

15. A memory-centric computing engine according to claim 13 further comprising logic coupled to the DRAM array data port for improving access time matching between the external bus and the DRAM array.

16. A memory-centric computing engine according to claim 15 wherein said logic includes a latch and a multiplexer for writing multiple data words into the latch.

17. A memory-centric computing engine according to claim 13 wherein the DRAM array includes SRAM cells providing faster access for a selected first portion of each row of the DRAM array so that data stored in the first portion becomes available for transfer with reduced latency in a read operation.

18. A memory-centric computing engine for connection to an external processor bus to supplement operation of a CPU also coupled to the processor bus, the computing engine comprising:
a bus interface controller (BIC) for interfacing the engine to the processor bus;
an array of DRAM memory on board the computing engine, the DRAM memory including an I/O memory block and an execution memory block;
an execution unit coupled directly to the execution memory block of the DRAM array for executing selected operations on data stored in the DRAM array; and
a memory-centric controller for controlling and addressing the DRAM array; and
a buffer memory under control of the bus interface controller and coupled both to the processor bus and to the I/O memory block of the DRAM memory array for buffering data transfers between the processor bus and the DRAM memory array so as to support execution in the execution unit concurrently with data transfer between the DRAM array and the buffer memory.

19. A memory-centric computing engine according to claim 18 wherein the buffer memory is coupled to the DRAM array via an internal data bus and the bus interface controller provides control signals to the MCC indicative of status conditions of the buffer memory to coordinate buffer memory data transfers.

20. A memory-centric computing engine according to claim 19 wherein the BIC buffer memory comprises multiple reconfigurable blocks of SRAM memory cells.

21. A method of interfacing a standard processor bus to a memory-centric computation engine attached to the processor bus, to carry out selected operations in the computation engine, the method comprising the steps of:

on the standard processor bus, asserting a first predetermined address;

in the computation engine, detecting the first predetermined address;

in the computation engine, responsive to detecting the first predetermined address, loading microcode into the computation engine under control of a memory-centric controller (MCC) on board the computation engine;

asserting a second predetermined address on the processor bus;

in the computation engine, detecting the second predetermined address;

in the computation engine, responsive to detecting the second predetermined address, initiating a selected engine library operation;

asserting a third predetermined address on the processor bus; and in the computation engine, detecting the third predetermined address;

in the computation engine, responsive to detecting the third predetermined address, initiating an I/O operation between the processor bus and the computation engine under control of the MCC to acquire data for the selected library operation; and then executing the selected library operation on the acquired data.

22. A method of interfacing a standard processor bus to a memory-centric computation engine according to claim 21 wherein the engine library operations include calculating FFT, convolution and/or FIR operations.

23. A method of interfacing a standard processor bus to a memory-centric computation engine according to claim 21 wherein the engine library operations include MPEG encoding and/or decoding operations.

24. A method of interfacing a standard processor bus to a memory-centric computation engine according to claim 21 wherein said initiating a selected engine library operation includes initiating a predetermined microcode sub-routine for reordering selected locations in a memory array on board the engine.

25. A method of interfacing a processor bus to a computation engine having a microprogrammable memory-centric controller (MCC) and an array of memory, the method comprising of:

providing a predetermined series of microcode instructions for execution by the MCC;

selecting a start address within the series of microcode instructions for carrying out a corresponding operation; and executing the series of microcode instructions in the MCC beginning at the selected start address so as to carry out the corresponding operation in the engine;

wherein said selecting step includes decoding an address asserted by the processor and said decoding step includes microprogramming the MCC, including providing a lookup table so as to enable the MCC to translate the asserted address into the microcode start address.

* * * * *

UNITED STATES PATENT AND TRADEMARK OFFICE
CERTIFICATE OF CORRECTION

PATENT NO. : 6,691,206 B1
DATED : February 10, 2004
INVENTOR(S) : Rubinstein

It is certified that error appears in the above-identified patent and that said Letters Patent is hereby corrected as shown below:

Title page,
Item [63], Related U.S. Application Data, replace "Jun. 21, 1997" with
-- Jun. 4, 1997 --.
Item [56], References Cited, U.S. PATENT DOCUMENTS, replace "4,757,393 A" with -- 4,754,393 A --.
FOREIGN PATENT DOCUMENTS, replace "EP 9703849.1    5/1997" with
-- EP 9703849.1         9/1997 --.

Column 7,
Line 7, replace "SRAM cell 95" with -- SRAM cells 95 --.

Column 8,
Line 40, replace "microcode. p A further" with -- microcode. A further --.

Column 9,
Line 50, replace "21x710initiates" with -- 21x710 initiates --.

Column 10,
Line 53, replace "instruction on in the" with -- instruction in the --.

Column 12,
Line 2, replace "microcode in the" with -- microcode into the --.
Line 13, replace "a memory controller (MCC)" with -- a memory-centric controller (MCC) --.
Line 21, replace "processing bus" with -- processor bus --.
Line 22, replace "an executing memory" with -- an execution memory --.
Line 45, replace "faster access for" with -- faster access time for --.
Line 61, replace "the DRAM array; and" with -- the DRAM array; --.

Column 13,
Line 35, replace "on the processor bus; and" with -- on the processor bus; --.

UNITED STATES PATENT AND TRADEMARK OFFICE
CERTIFICATE OF CORRECTION

PATENT NO. : 6,691,206 B1
DATED : February 10, 2004
INVENTOR(S) : Rubinstein

It is certified that error appears in the above-identified patent and that said Letters Patent is hereby corrected as shown below:

<u>Column 14,</u>
Line 24, replace "comprising of:" with -- comprising the steps of: --.

Signed and Sealed this

Twenty-first Day of February, 2006

JON W. DUDAS
*Director of the United States Patent and Trademark Office*